United States Patent
Sasaki et al.

(10) Patent No.: US 6,533,965 B1
(45) Date of Patent: Mar. 18, 2003

(54) TRANSPARENT ELECTRICALLY CONDUCTIVE OXIDE FILM FOR AN ELECTRONIC APPARATUS AND RELATED METHOD

(75) Inventors: Makoto Sasaki, Miyagi-ken (JP); Chae Gee Sung, Inchon-shi (KR); Kazuyuki Arai, Fukushima-ken (JP)

(73) Assignees: Alps Electric Co., LTD, Tokyo (JP); LG. Philips LCD Co., Ltd., Seoul (KR)

( * ) Notice: Subject to any disclaimer, the term of this patent is extended or adjusted under 35 U.S.C. 154(b) by 168 days.

(21) Appl. No.: 09/718,982

(22) Filed: Nov. 22, 2000

(30) Foreign Application Priority Data

Nov. 26, 1999 (JP) .............................................. 11-336865

(51) Int. Cl.$^7$ ......................... H01B 1/08; G02F 1/1333; G02F 1/1345
(52) U.S. Cl. ............................... 252/519.5; 252/520.1; 349/158; 349/122; 349/139
(58) Field of Search ........................... 252/519.5, 520.1; 349/158, 122, 139

(56) References Cited

U.S. PATENT DOCUMENTS 4,571,361 A * 2/1986 Kawaguchi et al. ......... 428/328
5,843,341 A * 12/1998 Orita et al. ............... 252/519.1
5,972,527 A 10/1999 Kaijou et al.

FOREIGN PATENT DOCUMENTS

JP          10-83719      * 3/1998

* cited by examiner

Primary Examiner—Mark Kopec
(74) Attorney, Agent, or Firm—Brinks Hofer Gilson & Lione

(57) ABSTRACT

A transparent electrically conductive oxide film is composed of a compound oxide containing indium oxide, tin oxide, and zinc oxide and includes a connecting section, in which the tin content is higher than the zinc content at least in connecting section, and at least the connection section has crystallinity. Alternatively, in the transparent electrically conductive oxide film, the atomic percentage of zinc to the total of zinc, indium, and tin is in the range of about 1 at % through about 9 at %, the atomic ratio of tin to zinc is about 1 or more, the atomic percentage of tin to the total of zinc, indium, and tin is about 20 at % or less, and at least a portion thereof has crystallinity. An electronic apparatus provided with such a transparent electrically conductive oxide film as at least a portion of the electric circuit thereof, a target for forming a transparent electrically conductive oxide film, and a method for fabricating a substrate provided with a transparent electrically conductive oxide film are also disclosed.

4 Claims, 18 Drawing Sheets

TRANSPARENT ELECTRICALLY CONDUCTIVE OXIDE FILM FOR AN ELECTRONIC APPARATUS AND RELATED METHOD

BACKGROUND OF THE INVENTION

1. Field of the Invention

The present invention relates to a transparent electrically conductive oxide film having superior fine workability, which may be easily etched by weak acids and in which the connection resistance is decreased, and to a technique using the same.

2. Description of the Related Art

Indium-tin-oxide (ITO) films are well known as transparent electrically conductive films used for electrode circuits, pixel electrodes, and the like, in liquid crystal display devices. Since the indium-tin-oxide film which is deposited at elevated temperature and which is in the polycrystalline state has a substantially low resistance of about $200 \times 10^{-6}$ $\Omega \cdot cm$, it has superior low resistivity and high transmittance, which are necessary in conductors for liquid crystal display devices. ITO films have low contact resistance which may be used as the contact resistivity without any problems when tape carrier package (TCP) connection is performed. In order to form circuits and pixel electrodes by etching such indium-tin-oxide films, strong acid etchants, such as a mixed acid of HCl and $HNO_3$, or a mixed acid of HCl and $H_2SO_4$, are required. However, if indium-tin-oxide films are etched using such strong acid etchants, the amounts of side etching will be high, resulting in difficulties in fine working.

Furthermore, as liquid crystal devices are increasingly miniaturized, as wiring in sections other than electrodes and wiring composed of indium-tin-oxide films, in which the resistance must be further decreased, wiring composed of copper is coming into use instead of wiring composed of chromium or wiring composed of tantalum as has been used.

However, the strong acid etchants used for etching indium-tin-oxide films are highly capable of etching copper wiring. Since there is a large difference in etching rate between the indium-tin-oxide films and copper and the side etching amount is also increased, if the strong acids for etching the indium-tin-oxide films are used, the copper wiring may be disconnected. Conversely, it is not possible to etch the indium-tin-oxide films using diluted hydrochloric acid or organic acids which are not likely to overetch copper wiring.

Additionally, a technique is also known in which an indium-tin-oxide film in the amorphous state is obtained by a special production method. The amorphous indium-tin-oxide can be etched by organic acids. However, the amorphous indium-tin-oxide film h as high contact resistance, which is disadvantageous.

When the indium-tin-oxide film is deposited at room temperature, a microcrystalline structure is easily produced go, and the resistance is increased to about $1,000 \times 10^{-6}$ $\Omega \cdot cm$, and thus, satisfactory connection resistance is not obtained.

Therefore, as transparent electrically conductive films, indium-zinc-oxide (IZO) films are receiving attention instead of indium-tin-oxide films. An indium-zinc-oxide film is known to be a superior transparent electrically conductive film suitable for fine working because an IZO film has a resistance as low as about $400 \times 10^{-6}$ $\Omega \cdot cm$ even if deposited at room temperature. IZO films have substantially the same transmittance as that of an indium-tin-oxide film. ITO films may be etched by weak acids, and the side etching amount is small when etched by weak acids. Furthermore, if the indium-zinc-oxide film is used, for example, diluted hydrochloric acid may be selected as an etchant so as not to etch copper wiring. By using the diluted hydrochloric acid etchant, fine working can be performed even if the circuit structure in which the indium-zinc-oxide film and copper wiring are combined is employed.

However, when the indium-zinc-oxide film is used as wiring for liquid crystal devices and the wiring is used for TCP connection, the connection resistance increases, giving rise to a problem in the case when the miniaturization of wiring in liquid crystal devices is further promoted. The present inventors have also found that when the indium-zinc-oxide film is stored in air, contact resistance increases over time.

Other systems, methods, feature, and advantages of the invention will be or will become apparent to one skilled in the art upon examination of the following section figures and detailed description. All such additional systems, methods, features, and advantages are intended to be included within this description, within the scope of the invention, and protected by the accompanying claims.

SUMMARY OF THE INVENTION

In view of the problems described above, it is an object of the present invention to provide a transparent electrically conductive oxide film which may be etched by weak acids in fine working, and which has low connection resistance and superior transmittance, in which resistance may be also decreased when taped carrier package (TCP) connection is performed, and resistance does not vary with time.

It is another object of the present invention to provide a target which is suitable for use in forming a transparent electrically conductive oxide film having such superior characteristics.

It is another object of the present invention to provide a method for fabricating a substrate provided with the transparent electrically conductive oxide film and to provide a liquid crystal display device provided with a substrate obtained by the fabrication method.

The resistance of an indium-zinc-oxide film may increase when TCP connection is performed. When either an indium-tin-oxide (ITO) film or an indium-zinc-oxide (IZO) film is in the amorphous state, a high-resistivity layer is formed in the surface region when left in air due to reaction with moisture, oxygen, or organic substances. The high-resistivity layer may form because a deficiency in oxygen in $In_2O_3$ (excess In) which is a source of electron carriers of the indium-zinc-oxide film is combined with moisture, oxygen, or organic substances in air, and thus the oxygen-deficiency type conductive mechanism is inhibited.

In one aspect a transparent electrically conductive oxide film is composed of a compound oxide containing indium oxide, tin oxide, and zinc oxide, and includes at least a connecting section, in which the tin content is higher than the zinc content in the connecting section, and at least the connecting section has crystallinity.

In the transparent electrically conductive oxide film composed of the compound oxide containing indium oxide, tin oxide, and zinc oxide, in which the tin content is higher than the zinc content at least in the connecting section, and at least the connecting section has crystallinity, in addition to the conductive mechanism in which excess indium of the indium oxide produces electron carriers, the conductive mechanism in which tetravalent tin is activated to increase electron carriers by adding tin as an n-type dopant to indium functions effectively, and simultaneously, an inhibition factor of zinc which consumes electron carriers can be reduced because activated tin acts as an acceptor for electron carriers. Thus, reaction with moisture, oxygen, or organic substances in air is inhibited, and satisfactory low resistance connection is anticipated. Since the transparent electrically conductive oxide film described above can also be easily etched by weak acids and the side etching amount thereof is small, finer working of wiring is possible in comparison with an indium-tin-oxide film. Furthermore, since the transparent electrically conductive oxide film can be etched by weak acids, even if the structure provided with copper wiring is employed, it is possible to carry out etching treatment without eroding the copper wiring.

In one aspect, a transparent electrically conductive oxide film is composed of a compound oxide containing indium oxide, tin oxide, and zinc oxide, in which the atomic percentage of zinc to the total of zinc, indium, and tin is in the range of about 1 at % through about 9 at %, the atomic ratio of tin to zinc is about 1 or more, the atomic percentage of tin to the total of zinc, indium, and tin is about 20 at % or less, and at least a portion thereof has crystallinity.

By setting the contents of zinc, indium, and tin in the ranges described above, the film may be deposited in the amorphous state and then at least the connecting section thereof may be easily crystallized, satisfactory conductivity can be secured by increasing electron carriers by tin, the inhibition factor of zinc which consumes electron carriers is eliminated, and reaction with moisture, oxygen, or organic substances in air can be inhibited.

Preferably, the atomic percentage of zinc to the total of zinc, indium, and tin is in the range of about 2 at % through about 7 at %, and the atomic-percentage of tin to the total of zinc, indium, and tin is in the range of about 5 at % through about 10 at % so that satisfactory conductivity and reaction inhibiting ability are obtained.

An electronic apparatus includes the transparent electrically conductive oxide film as at least a portion of the electric circuit thereof.

In the electronic apparatus provided with the transparent electrically conductive oxide film, even if a miniaturized wiring structure is employed, it is possible to connect the transparent electrically conductive oxide film to other components with low resistance, and even if left in air, connection resistance is not greatly deteriorated. Etching can be performed using weak acids. Thus, it is possible to provide an electronic apparatus provided with wiring which can be subjected to fine working.

Furthermore, a target is composed of a compound oxide containing indium oxide, tin oxide, and zinc oxide, in which the atomic percentage of zinc to the total of zinc, indium, and tin is in the range of 1 at % through about 12 at %, the atomic ratio of tin to zinc is about 1 or, more, and the atomic percentage of tin to the total of zinc, indium, and tin is about 22 at % or less.

If the target having the composition described above is used as a target for deposition by sputtering, even if the miniaturized wiring structure is employed, it is possible to obtain wiring of a transparent electrically conductive film in which connection to other components can be performed with low resistance, connection resistance is not greatly deteriorated if left in air, etching may be performed by weak acids, and fine working can be performed.

In the target of the present invention, preferably, the atomic percentage of zinc to the total of zinc, indium, and tin is in the range of about 2 at % through about 10 at %, and the atomic percentage of tin to the total of zinc, indium, and tin is in the range of about 5 at % through about 12 at %.

In accordance with the present invention, a method for fabricating a substrate provided with a transparent electrically conductive oxide film includes the steps of depositing a transparent electrically conductive amorphous oxide film onto the substrate, the transparent electrically conductive amorphous oxide film being composed of a compound oxide containing indium oxide, tin oxide, and zinc oxide, in which the atomic ratio of tin to zinc is about 1 or more; patterning the transparent electrically conductive amorphous oxide film by etching; and then performing heat treatment so that at least a portion of the transparent electrically conductive amorphous oxide film which has been patterned is crystallized.

In the transparent electrically conductive amorphous oxide film composed of the compound oxide containing indium oxide, tin oxide, and zinc oxide, in which the tin content is higher than the zinc content at least in a connection section, and at least the connecting section has crystallinity, as the conductive mechanism of the indium-zinc-oxide, a conductive mechanism in which electron carriers are increased by activation due to the addition of tin as an n-type dopant to indium functions effectively, and simultaneously, an inhibition factor of zinc which consumes electron carriers can be reduced because activated tin acts as an acceptor for electron carriers. Thus, it is possible to provide a substrate provided with wiring in which reaction with moisture, oxygen, or organic substances in air is inhibited, and satisfactory connection is performed. Additionally, with respect to the compound oxide described above, etching can be performed by weak acids in the amorphous state when deposited, fine working is possible, and connection with low resistance can be performed after crystallization.

In accordance with the present invention, a method for fabricating a substrate provided with a transparent electrically conductive oxide film includes the steps of depositing a transparent electrically conductive amorphous oxide film onto the substrate, the transparent electrically conductive amorphous oxide film being composed of a compound oxide containing indium oxide, tin oxide, and zinc oxide, in which the atomic percentage of zinc to the total of zinc, indium, and tin is in the range of about 1 at % through about 9 at %, the atomic ratio of tin to zinc is about 1 or more, and the atomic percentage of tin to the total of zinc, indium, and tin is about 20 at % or less; patterning the transparent electrically conductive amorphous oxide film by etching; and then performing heat treatment so that at least a portion of the transparent electrically conductive amorphous oxide film which has been patterned is crystallized.

In accordance with the present invention, a liquid crystal display device includes a liquid crystal sandwiched between a pair of substrates, in which at least one of the pair of substrates comprises the substrate provided with the transparent electrically conductive oxide film described above.

It is thereby possible to provide a liquid crystal display device having the substrate provided with the transparent electrically conductive oxide film having the characteristics described above.

BRIEF DESCRIPTION OF THE DRAWINGS

The invention may be better understood with reference to the following section figures and detailed description. The components in the figures are not necessarily to scale, emphasis placed upon illustrating the principles of the invention. Moreover, like reference numerals in the figures designate corresponding parts throughout the different views.

DESCRIPTION OF THE PREFERRED EMBODIMENTS

Figure 1:
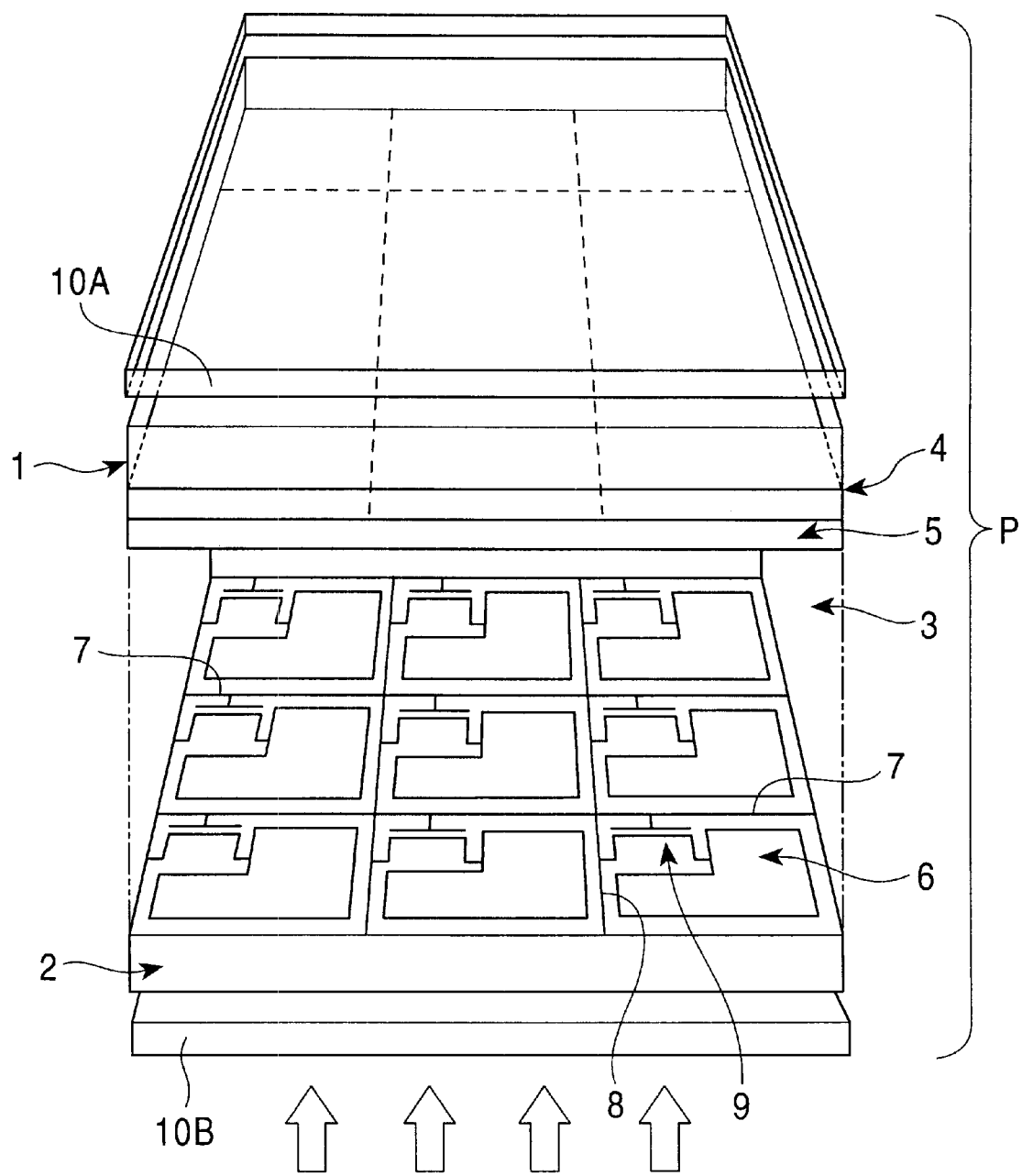
FIG. 1 is a schematic diagram showing a liquid crystal panel provided with a transparent electrically conductive oxide film according to an embodiment.

Embodiments of the present invention are described in detail below.

A transparent electrically conductive oxide film of the present invention is composed of a compound oxide containing indium oxide ($IN_2O_3$), tin oxide ($SnO_2$), and zinc oxide (ZnO) as principal ingredients. The transparent electrically conductive oxide film may contain approximately several atomic percents of impurities, in addition to the oxides as the principal ingredients.

The transparent electrically conductive oxide film in this embodiment is used while being connected to other wiring or conductors, in the connecting sections thereto. In one aspect, the tin content is higher than the zinc content, and crystallinity is exhibited. Other ingredients may have a higher content than the zinc content in this aspect, when the surface section of the transparent electrically conductive oxide film is connected to wiring or other conductors, with respect to the composition in the surface section, at least the tin content is higher than the zinc content, and crystallinity is exhibited.

Next, in a transparent electrically conductive oxide film, the atomic percentage of zinc to the total of zinc, indium, and tin is in the range of about 1 at % through about 9 at %, the atomic ratio of tin to zinc is about 1 or more, the atomic percentage of tin to the total of zinc, indium, and tin is about 20 at % or less, and preferably, in the range of about 1 at % through about 20 at %.

Preferably, the atomic percentage of zinc to the total of zinc, indium, and tin is in the range of about 2 at % through about 7 at %, and the atomic percentage of tin to the total of zinc, indium, and tin is in the range of about 5 at %, through about 10 at %. Furthermore, with respect to the compositional range of indium, the atomic percent of indium to the total of zinc, indium, and tin is in the range of about 75 at % through about 98 at %.

The indium oxide is a principal ingredient, and excess. indium which is not bonded to oxygen in the compound oxide generates electron carriers to constitute an oxygen-deficiency type conductive mechanism. The tin oxide as an additive ingredient is important in activating tetravalent tin in the compound oxide to generate electron carriers. If the compound oxide is in the amorphous state, since bivalent zinc in the zinc oxide is not activated, it does not act as an acceptor for consuming electron carriers. The compositional ranges described above are chosen in consideration of the balance between the additives.

When the transparent electrically conductive oxide film is used as actual wiring, preferably, at least connecting sections to other wiring and terminals have crystallinity. Although the transparent electrically conductive oxide film within the compositional ranges described above is an amorphous film as it is deposited under normal conditions, it is easily crystallized by annealing treatment in which heating is performed at temperatures higher than the crystallization temperature. In one aspect, the heat treatment is in the range of about 180° C. through about 300° C.). Additionally, although the heat treating temperature may be selected depending on the heat resistance of peripheral circuits and the substrate, when the transparent electrically conductive oxide film is used for a liquid crystal panel which will be described below, the heat treating temperature is preferably set at about 250° C. or less, and more preferably, at about 200° C., in view of the heat resistance of peripheral circuits and the substrate.

With respect to the transparent electrically conductive oxide film having the composition described above, the TCP contact resistance is high (about 41Ω), which is not satisfactory resistance for fine wiring connection, in the amorphous state when the transparent electrically conductive oxide film is deposited and before heat treatment is performed. However, by crystallizing at least the surface section (in a depth of about 50 Å from the surface) by heat treatment, the resistance of at least the connecting section may be decreased (about 2.3Ω). The heat treatment for crystallization may be performed in any one of atmospheres selected from the group consisting of in air, in an atmosphere of $N_2$, in an atmosphere of 20% $H_2$ and 80% $N_2$, in an atmosphere of 20% $O_2$ and 80% $N_2$, and in a vacuum. Additionally, since the crystallized transparent electrically conductive oxide film is prevented from being bonded to moisture (or oxygen) in air, the connection resistance does not increase over time.

Since the amorphous transparent electrically conductive oxide film having the composition described above may be easily etched by weak acids, such as diluted hydrochloric acid or organic acids, the transparent electrically conductive oxide film may be subjected to etching treatment while being in the amorphous state, followed by patterning to form wiring. After patterning is performed, necessary sections, such as connecting sections to wiring, may be subjected to heat treatment so that the resistance of the connecting sections to wiring is decreased, and thus connection may be performed with low resistance even in connecting sections in miniaturized circuits.

Next, in order to form the transparent electrically conductive oxide film having the composition described above, deposition may be performed by sputtering and other suitable deposition techniques onto the upper surface of an insulating substrate, and the like, followed by heat treatment, and as a target used in such a case, the target having the composition described below is preferably used.

The target preferably used is composed of a compound oxide containing indium oxide, tin oxide, and zinc oxide, in which the atomic percentage of zinc to the total of zinc, indium, and tin is in the range of about 1 at % through about 12 at %, the atomic ratio of tin to zinc is about 1 or more, and the atomic percentage of tin to the total of zinc, indium, and tin is about 22 at % or less.

In the target, more preferably, the atomic percentage of zinc to the total of zinc, indium, and tin is in the range of about 2 at % through about 12 at %, and the atomic percentage of tin to the total of zinc, indium, and tin is in the range of about 5 at % through about 12 at %.

In the target for producing the transparent electrically conductive oxide film having the composition described above, since zinc and tin are easy to fly and are difficult to be incorporated into the film during sputtering, the contents of zinc and tin in the target are higher than those in the film to be formed.

Figure 2:
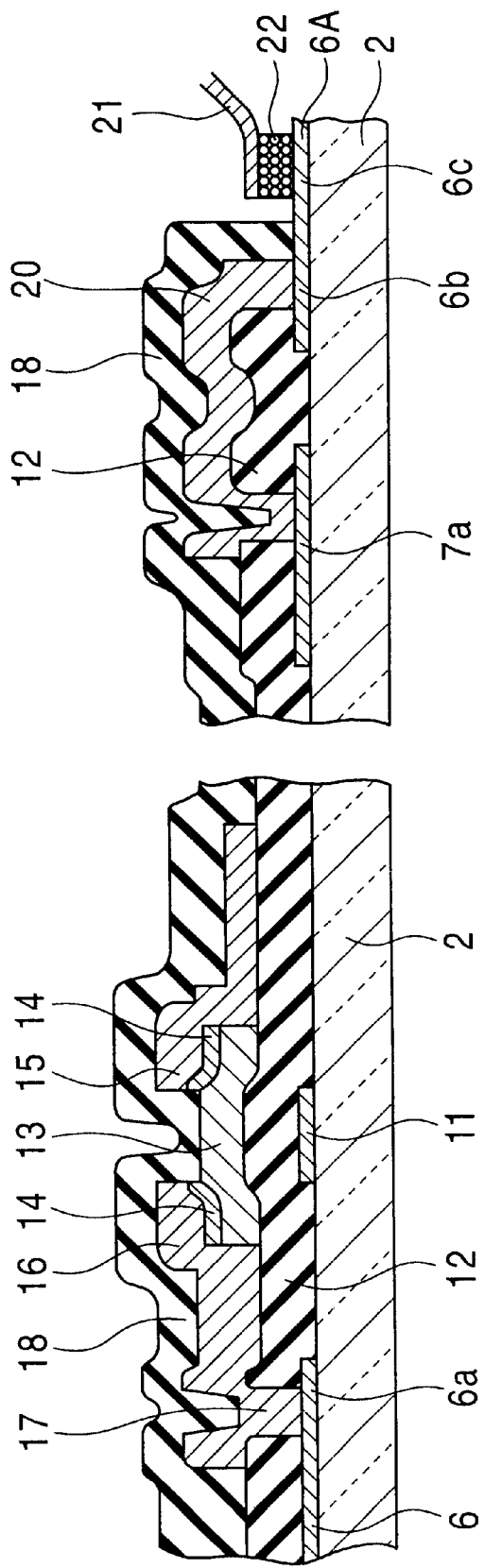
FIG. 2 is a sectional view which shows structures of the portion of a thin-film transistor and the portion of a gate terminal in a first example to be provided in the liquid crystal panel shown in FIG. 1.
Figure 3:
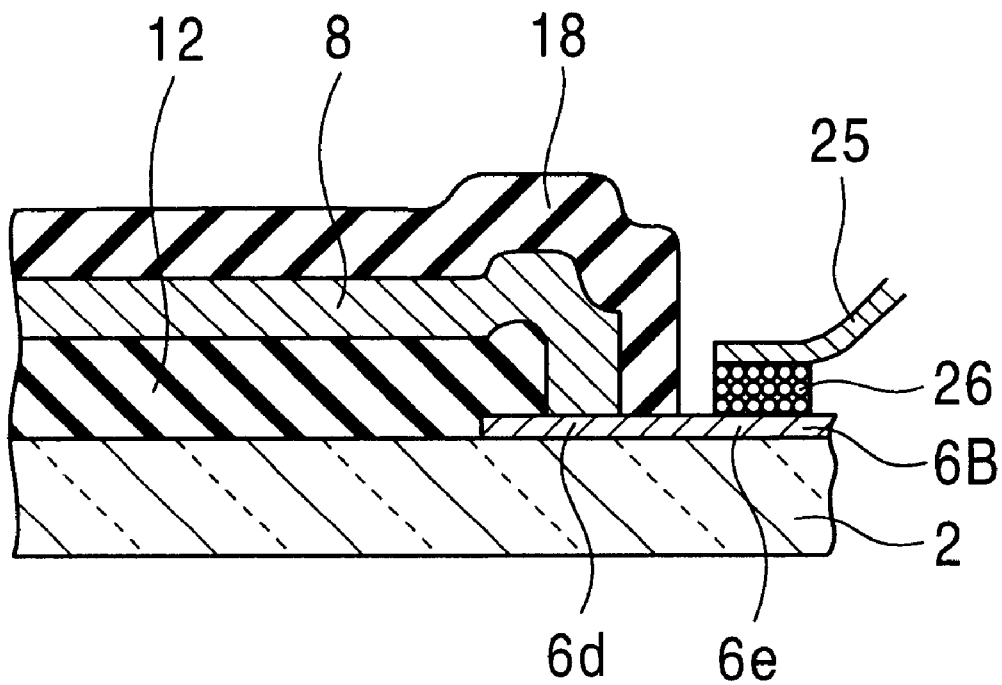
FIG. 3 is a sectional view which shows the structure of the portion of a source terminal according to a first embodiment to be provided in the liquid crystal panel shown in FIG. 1.

FIGS. 1 to 3 show a first embodiment of an active matrix liquid crystal panel (electronic apparatus) fabricated using the transparent electrically conductive oxide film in this embodiment.

A liquid crystal panel P in this example includes upper and lower transparent substrates 1 and 2 opposed to each other, and a liquid crystal 3 sealed therebetween. A color filter 4 and a common electrode 5 composed of the transparent electrically conductive oxide film having the composition described above are formed on the liquid crystal side of the upper substrate 1, and a plurality of pixel electrodes 6 composed of the transparent electrically conductive oxide film having the composition described above are formed in a matrix on the upper surface of the lower substrate 2. Gate lines 7 and source lines 8, which are composed of an electrically conductive metallic material, such as copper, are arrayed in a matrix in regions between the pixel electrodes 6 on the upper surface of the lower substrate 2. The pixel electrodes 6 are disposed and also thin-film transistors (TFTs) 9, which act as switching elements for connecting the individual pixel electrodes 6 to the gate lines 7 or the source lines 8, are formed in the regions surrounded by the gate lines 7 and the source lines 8. Furthermore, as shown in FIG. 1, polarizers 10A and 10B are disposed on the upper side of the substrate 1 and on the lower side of the substrate 2, respectively.

Additionally, although the liquid crystal panel P shown in FIG. 1 has only pixel electrodes 6 in 3 columns and 3 rows, in the actual liquid crystal panel, pixels in several hundred columns and several hundred rows are provided as effective display pixels, and pixel electrodes 6 in accordance with the number of the pixels are provided. Although connecting terminal sections are provided in connecting sections of the gate lines 7 and the source lines 8 in the frame section corresponding to a wiring region outside the effective display area (area in which the pixel electrodes 6 for displaying are formed) of the liquid crystal panel P, the connecting section of the gate lines and the connecting section of the source lines are omitted in FIG. 1 in order to simplify the drawing. Although the liquid crystal 3 is sealed and surrounded by a sealant (not shown in the drawing) formed in the peripheries of the substrates 1 and 2 and the substrates 1 and 2, the structure of the sealant is also omitted in FIG. 1.

With respect to the liquid crystal panel P having the structure shown in FIG. 1, wiring of the TFT 9 and the periphery thereof is constructed, for example, as shown in FIGS. 2 and 3.

As shown in FIG. 2, a gate electrode 11 lead from a portion of the gate line 7 and the pixel electrode 6 are formed on the substrate 2, a gate insulating layer 12 is formed so as to cover them, and an island-like semiconductor layer 13 is formed on the gate insulating layer 12 over the gate electrode 11. A source electrode 15 and a drain electrode 16 are formed on both ends of the semiconductor layer 13 with ohmic contact layers 14 therebetween, the source electrode 15 is connected to the source line 8, and the drain electrode 16 is connected to the pixel electrode 6 via a conducting section 17 which corresponds to a contact hole made in the gate insulating layer 12. The contact section between the conducting section 17 and the pixel electrode 6 is a connecting section 6a, and an insulating layer 18 is further formed so as to cover these sections. Although an alignment layer is actually formed on the liquid crystal side of the substrate 2, the alignment layer is omitted in FIG. 2.

In the frame section in the periphery of the liquid crystal panel P, with respect to the terminal section of the gate line 7, as shown in FIG. 2, an end 7a of the gate line 7 is covered by the gate insulating layer 12, and a gate terminal 6A composed of the transparent electrically conductive oxide film having the composition described above is formed on the substrate 2 outside the end 7a of the gate line 7. The gate terminal 6A and the gate end 7a are connected to each other by a connecting layer 20 composed of the same electrically conductive material as that for the source line 8, and the portion thereof constitutes a connecting section 6b, and the connecting layer 20 is covered by the insulating layer 18. A terminal section 21 for performing TCP wiring is connected to the edge of the gate terminal 6A by a conducting layer 22 composed of an anisotropic contact film (ACF) or the like, and the portion thereof constitutes a connecting section 6c.

Next, in the frame section in the periphery of the liquid crystal panel P, with respect to the terminal section of the source line 8, as shown in FIG. 3, a source terminal 6B composed of the transparent electrically conductive oxide film having the composition described above is formed on the end of the gate insulating layer 12, the edge of the source line 8 is connected to the source terminal 6B, and the insulating layer 18 is formed so as to cover these connecting sections. A terminal section 25 for performing TCP wiring is connected to the edge of the source terminal 6B by a conducting layer 26 composed of an ACF or the like.

With respect to the liquid crystal panel P having the structure described above, in any one of the connecting section 6a in which the pixel electrode 6 is connected to the conducting section 17 of the drain electrode 16; the connecting section 6b in which the gate terminal 6A is connected to the connecting layer 20; and the connecting section 6c in which the gate terminal 6A is connected to the terminal section 21, which are shown in FIG. 2; a connecting section 6d in which the source terminal 6B is connected to the edge of the source line 8; and a connecting section 6e in which the source terminal 6B is connected to the terminal section 25, which are shown in FIG. 3, the transparent electrically conductive oxide film and other conductors are connected to each other.

Herein, if the pixel electrode 6, the gate terminal 6A, and the source terminal 6B are composed of the transparent electrically conductive oxide film, connection may be performed with low connection resistance in any one of the sections. Moreover, since such connecting sections are miniaturized as the liquid crystal panel P is miniaturized, and the width is as microscopic as in the range of about $5 \times 10^{-6}$ m through about $40 \times 10^{-6}$ m, fully satisfactory connection will be performed in the structure of a next-generation miniaturized panel in which the sizes of miniaturized connecting sections are further reduced.

In order to produce the structure shown in FIGS. 2 and 3, after the transparent electrically conductive oxide film in the amorphous state is formed, the pixel electrode 6, the gate terminal 6A, and the source terminal 6B are formed by etching, and then connection to conductive sections of other layers is performed. Herein, if the transparent electrically conductive oxide film having the composition described above is used, since weak acids, such as diluted hydrochloric acid or organic acids, instead of strong acids, may be used as an etchant, the side etching amount may be decreased, and thus a finer structure may be obtained by etching.

After the pixel electrodes 6 or terminals 6A and 6B having predetermined sizes are formed by finely etching the transparent electrically conductive oxide film, if the film in the amorphous state is crystallized by heating at a temperature that is higher than the crystallization temperature, the resistance of the crystallized sections can be decreased. Thus, connection to the drain electrode 16 and connection to the terminal sections 21 and 25 may be performed with low resistance.

As described above, if the transparent electrically conductive oxide film is etched in the amorphous state and then is crystallized to perform connection, the liquid crystal panel (electronic apparatus) P provided with sections in which connection is performed with decreased connection resistance, even in fine wiring sections, may be obtained.

Figure 4:
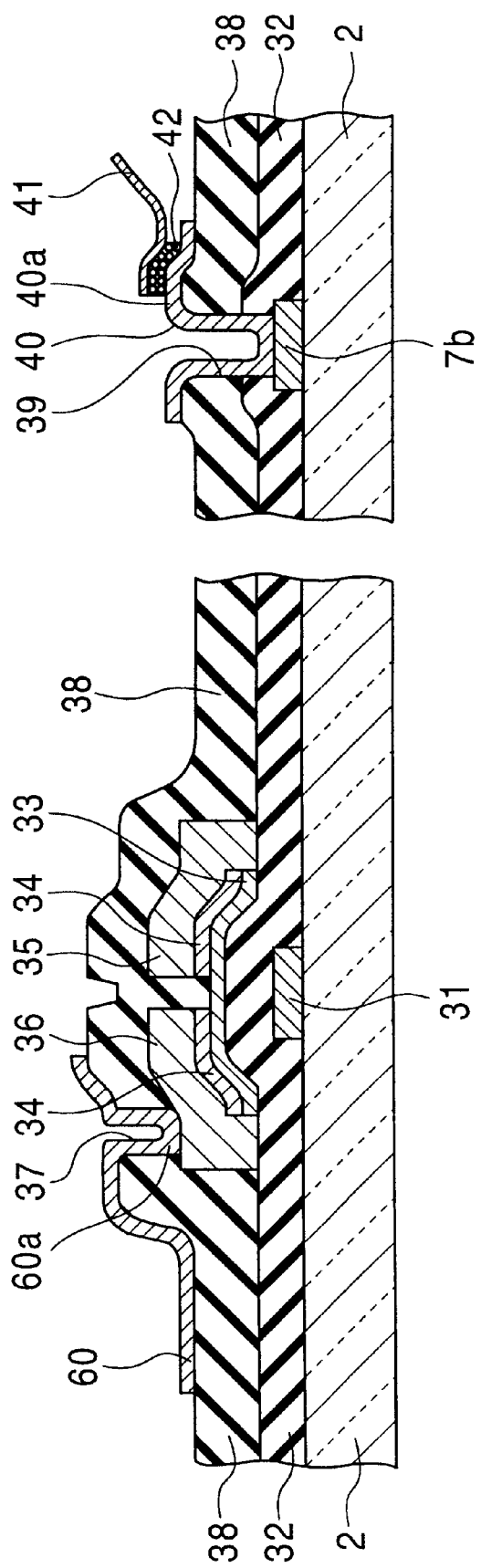
FIG. 4 is a sectional view which shows structures of the portion of a thin-film transistor and the portion of a gate terminal according to a second embodiment to be provided in the liquid crystal panel shown in FIG. 1.
Figure 5:
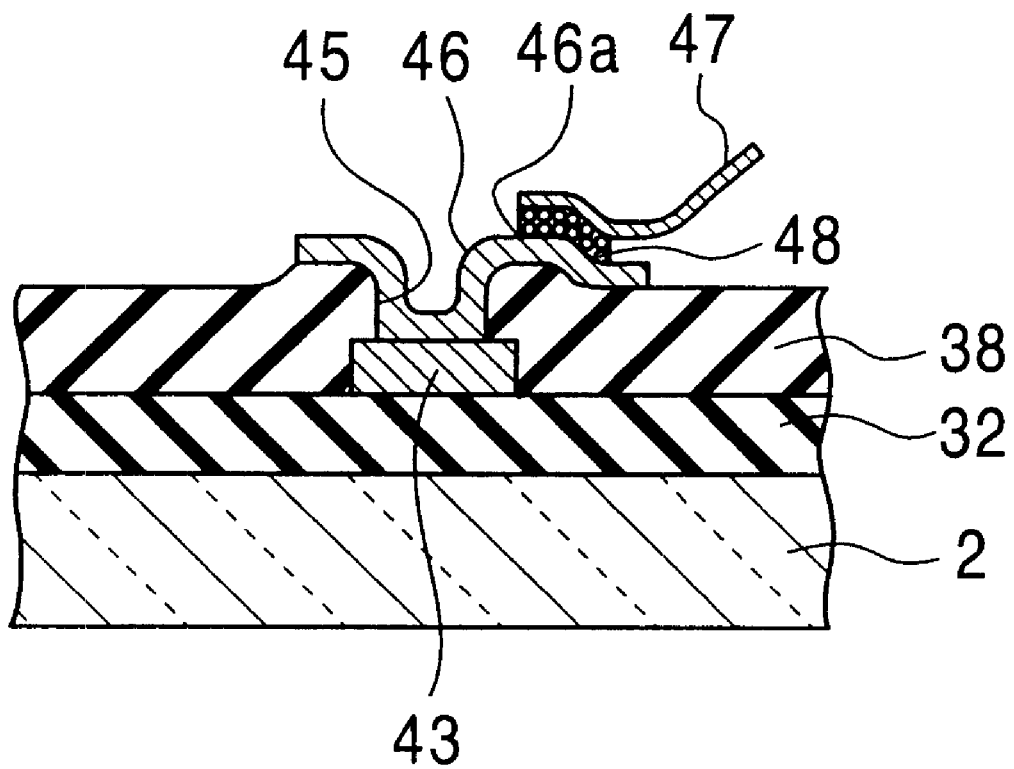
FIG. 5 is a sectional view which shows the structure of the portion of a source terminal in the second embodiment to be provided in the liquid crystal panel shown in FIG. 1.

FIGS. 4 and 5 show a second embodiment of the wiring structure of the thin-film transistor 9 and the periphery thereof constituting the liquid crystal panel P.

As shown in FIG. 4, a gate electrode 31 lead from a portion of the gate line 7 is formed on the substrate 2, a gate insulating layer 32 is formed so as to cover them, and an island-like semiconductor layer 33 is formed on the gate insulating layer 32 over the gate electrode 31. A source electrode 35 and a drain electrode 36 are provided on both ends of the semiconductor layer 33 with an ohmic contact layer 34 therebetween. The source electrode 35 is connected to the source line 8, and a pixel electrode 60 is formed on an insulating layer covering them. The drain electrode 36 is connected to a connecting section 60a of the pixel electrode 60 via a conducting section 37 which corresponds to a contact hole made in the insulating layer 38.

In the frame section in the periphery of the liquid crystal panel P, with respect to the terminal section of the gate line 7, as shown in FIG. 4, an end 7b of the gate line 7 is covered by the gate insulating layer 32 and the insulating layer 38, and a gate terminal 40, which is composed of the same transparent electrically conductive oxide film as the transparent electrically conductive oxide film constituting the pixel electrode 60, connected to the end 7b of the gate line 7, is formed so as to be embedded in a contact hole 39 made through the gate insulating layer 32 and the insulating layer 38. A terminal section 40a is formed in which a terminal section 41 for performing TCP wiring is connected to the end of the gate terminal 40 with a conducting layer 42, composed of an ACF or the like, therebetween.

Next, in the frame section in the periphery of the liquid crystal panel P, with respect to the terminal section of the source line 8, as shown in FIG. 5, a source terminal 43 composed of the same electrically conductive material as that for the source electrode 36 and the drain electrode 35 is formed on the gate insulating layer 32. A source terminal 46, which is composed of the transparent electrically conductive oxide film having the composition described above, is formed at a contact hole 45 made through the insulating layer 38 on the source terminal 43. A connecting section 46a is formed in which a terminal section 47 for performing TCP wiring is connected to the source terminal 46 with a conducting layer 48 composed of an ACF of the like therebetween.

In order to produce the structure shown in FIGS. 4 and 5, after the transparent electrically conductive oxide film is formed, the pixel electrode 60, the gate terminal 40, and the source terminal 46 are formed by etching, and then connection is performed. Herein, if the transparent electrically conductive oxide film having the composition described above is used, since weak acids instead of strong acids may be used as an etchant, the side etching amount may be decreased, and thus a finer structure may be obtained. After fine etching is performed to form the pixel electrode 60 or terminals 40 and 46 having predetermined sizes, if the amorphous film is crystallized by heating at a temperature that is higher than the crystallization temperature, the resistance of the crystallized sections may be decreased. Thus, connection to the drain electrode 36 and connection to the terminal sections 41 and 47 may be performed with low resistance.

As described above, if the transparent electrically conductive oxide film is etched in the amorphous state and then is crystallized to perform connection, the liquid crystal panel (electronic apparatus) P provided with sections in which connection is performed with decreased connection resistance, even in fine wiring sections, may be obtained.

Although the liquid crystal panel is described as an example of electronic apparatuses in the above-mentioned embodiment, it is to be understood that transparent electrically conductive oxide films of the present invention are widely applicable in various types of electronic apparatuses, other than the liquid crystal panel, which require transparent electrically conductive films.

EXAMPLES

On each of a plurality of glass substrates, any one of an indium-tin-oxide film (hereinafter referred to as an ITO film; In:Sn=about 92 at %:8 at %; about 1,200 Å thick), an indium-tin-zinc-oxide film, in one aspect an $In_2O_3$—$SnO_2$—ZnO film (hereinafter referred to as an ITZO film; In:Sn:Zn= about 88 at %:9 at %:3 at %; about 1,200 Å thick), and an indium-zinc-oxide film (hereinafter referred to as an IZO film; In:Zn=about 82 at %:18 at %; about 1,200 Å thick) was deposited at room temperature at an oxygen partial pressure of about $6.3 \times 10^{-3}$ Pa ($5 \times 10^{-5}$ Torr) using a sputtering system, and the X-ray diffraction peaks of the individual films were obtained. Targets used were a target with a compositional ratio In:Sn of about 90 at %:10 at % for the ITO film, a target with a compositional ratio In:Sn:Zn of about 85 at %:10 at %:5 at % for the ITZO film, and a target with a compositional ratio In:Zn of about 83 at %:17 at %.

Figure 6:
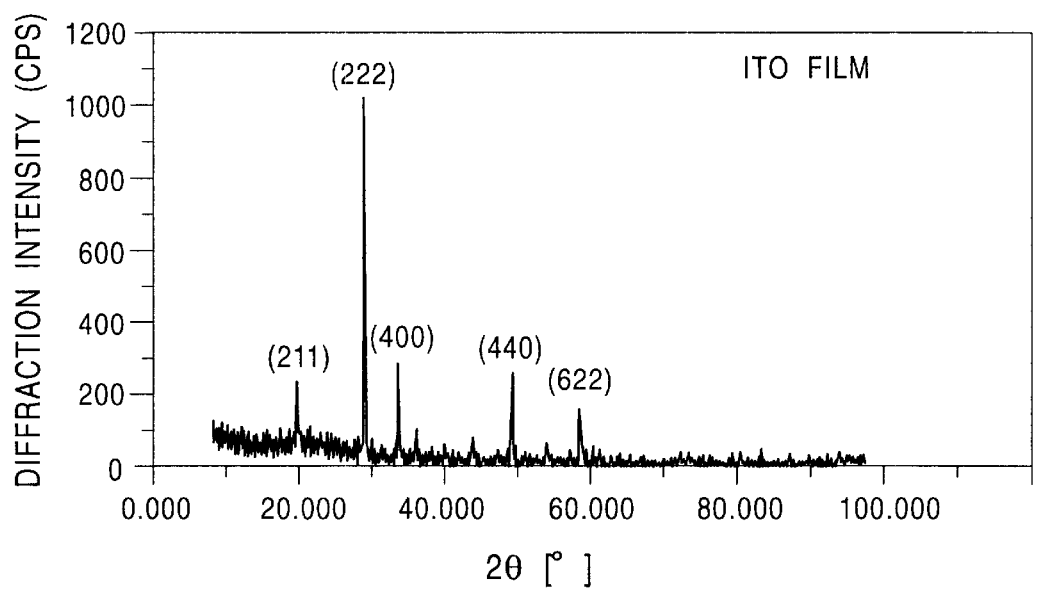
FIG. 6 shows the results of X-ray diffraction analysis of an ITO film.

With respect to the IZO film and the ITZO film, X-ray diffraction peaks were also observed after heat treatment was performed at about 250° C. for about 2 hours in an annealing furnace in an atmosphere of about 120% $H_2/N_2$. FIG. 6 shows the results for the ITO film, FIG. 7 shows the results for the ITZO films, and FIG. 8 shows the results for the IZO films.

Figure 7:
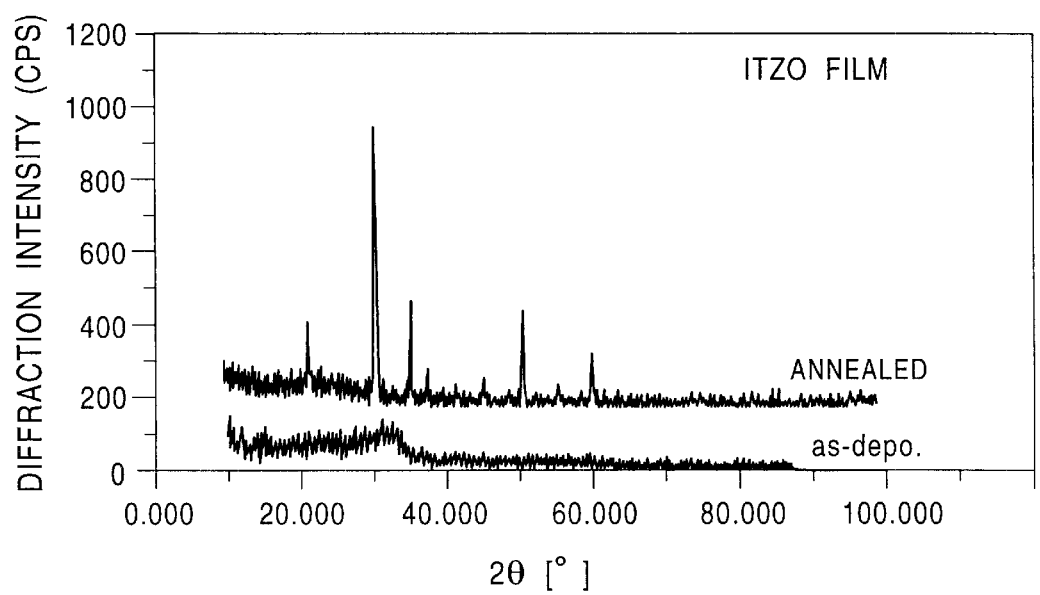
FIG. 7 shows the results of X-ray diffraction analysis of ITZO films.
Figure 8:
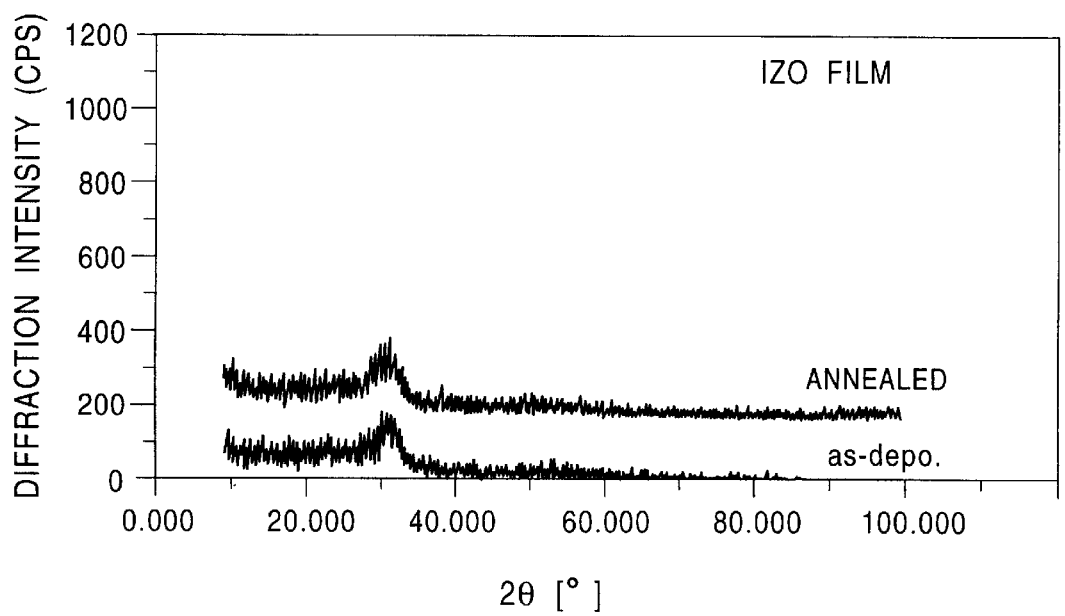
FIG. 8 shows the results of X-ray diffraction analysis of IZO films.

Referring to FIGS. 6 to 8, when deposited at room temperature, the ITO film exhibited crystallinity and both the ITZO film and the IZO film were amorphous films in which X-ray diffraction patterns showed broad curves. The ITZO film was crystallized when heat treatment was performed and the IZO film was not crystallized even when heat treatment was performed.

As a result, although the ITZO film having the composition in accordance with the present by invention is in the amorphous state when deposited, it may be crystallized by heat treatment.

The ITZO film in the amorphous state as deposited before heat treatment had a resistance of about $600 \times 10^{-6}$ Ω·cm, and the ITZO film after heat treatment had a resistance of about $250 \times 10^{-6}$ Ω·cm. As a result, the resistance decreases when the ITZO film in the amorphous state is crystallized.

Figure 9:
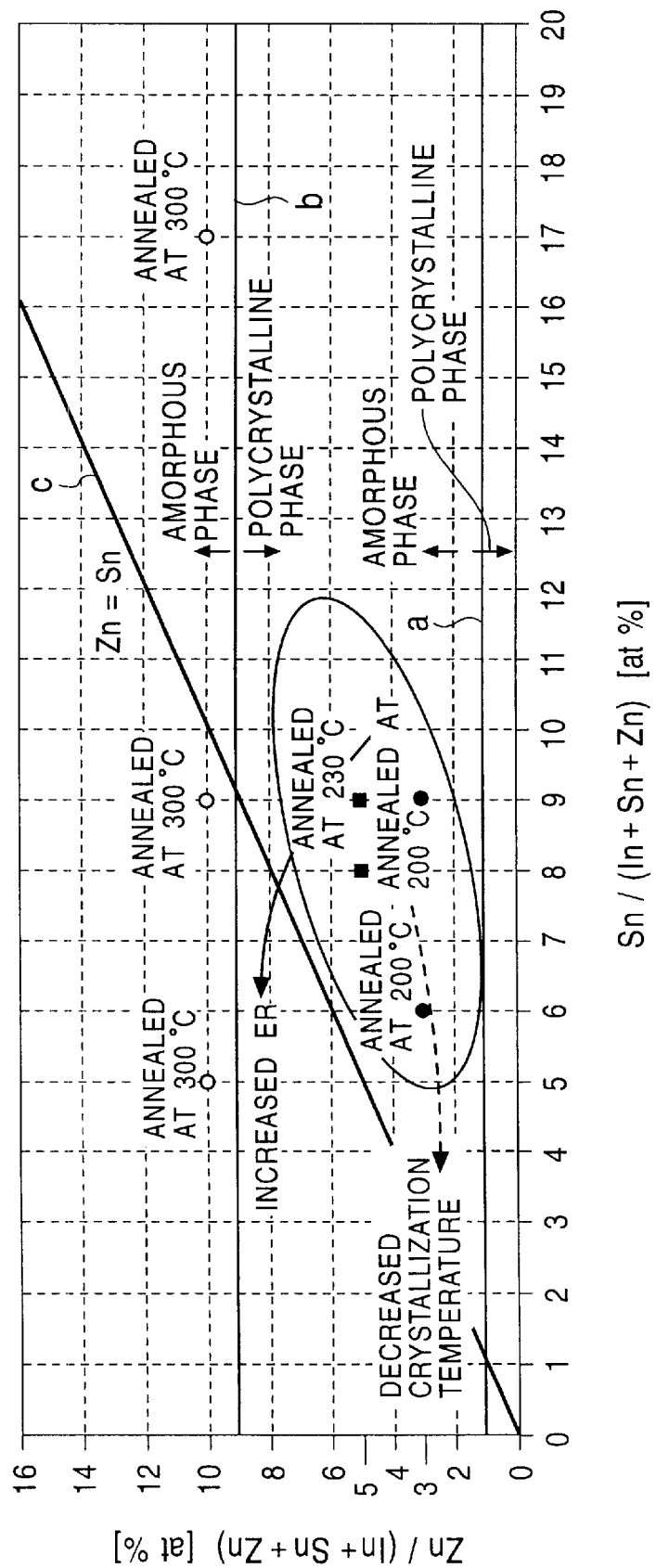
FIG. 9 is a diagram which shows the effect of the zinc content and the effect of the tin content when transparent electrically conductive oxide films are in the crystallized state or in the amorphous state.

FIG. 9 is a chart which shows whether the states after heat treatment are amorphous or polycrystalline with respect to indium tin zinc oxide films invention.

In the graph shown in FIG. 9, Zn/(In+Sn+Zn) [at %] in ordinate represents the atomic percentage of zinc to the total of zinc, indium, and tin, and Sn/(In+Sn+Zn) [at %] in abscissa represents the atomic percentage of tin to the total of zinc, indium, and tin.

The line a in FIG. 9 shows an atomic percentage of zinc to the total at 1 at %, the line b shows an atomic percentage of zinc to the total at 9 at %, and the line c shows an atomic ratio of tin to zinc at 1.

In FIG. 9, in the compositional range essentially below the line a, transparent electrically conductive oxide films are in the polycrystalline phase when deposited and they are not easily etched using weak acids. In FIG. 9, in the compositional range essentially above the line b, films as deposited in the amorphous state remain amorphous even if heat treatment (annealing) is performed, and the connection resistance thereof cannot be decreased. In FIG. 9, since the line c indicates that zinc and tin have the same compositional ratio, the percentage of electron carriers consumed by zinc is increased, and in the compositional range essentially above the line c, amounts of zinc for consuming electron carriers become excessive and low-resistance connection cannot be performed. Even in the compositional range below the line c, resistance tends to increase as the composition is brought closer to the line c.

In FIG. 9, both the films having a zinc content of about 10 at % and a tin content of about 5 at % and the film having a zinc content of about 10 at % and a tin content of about 9 at % were not crystallized even if heat treatment was performed at about 300° C. In contrast, both the film having a zinc content of about 5 at % and a tin content of about 18 at % and the film having a zinc content of about 5 at % and a tin content of about 9 at % were crystallized when heat treatment was performed at about 230° C. Furthermore, both the film having a zinc content of about 3 at % and a tin content of about 6 at % and the film having a zinc content of about 3 at % and a tin content of about 9 at % were crystallized when heat treatment was performed at about 200° C.

As a result, the crystallization temperature may be decreased by decreasing the zinc content. When transparent electrically conductive oxide films of the present invention are used for electronic apparatuses, heat treatment temperatures are preferably set as low as possible because of limitations in heat resistance of substrates or various layers deposited thereon. Therefore, it is believed that in order to decrease the heat treatment temperature and to simultaneously decrease the connection resistance, both the amount of zinc and the amount of tin to be added to indium are preferably set as small as possible.

Furthermore, in order to fully satisfy the various requirements described above, on condition that the atomic ratio of tin to zinc is about 1 or more, the zinc content is set aft in the range from about 1 at % through about 9 at %, and preferably, from about 2 at % through about 7 at %, and the tin content is set at about 20 at % or less, and preferably, in the range from about 5 at % through about 10 at %.

Figure 10:
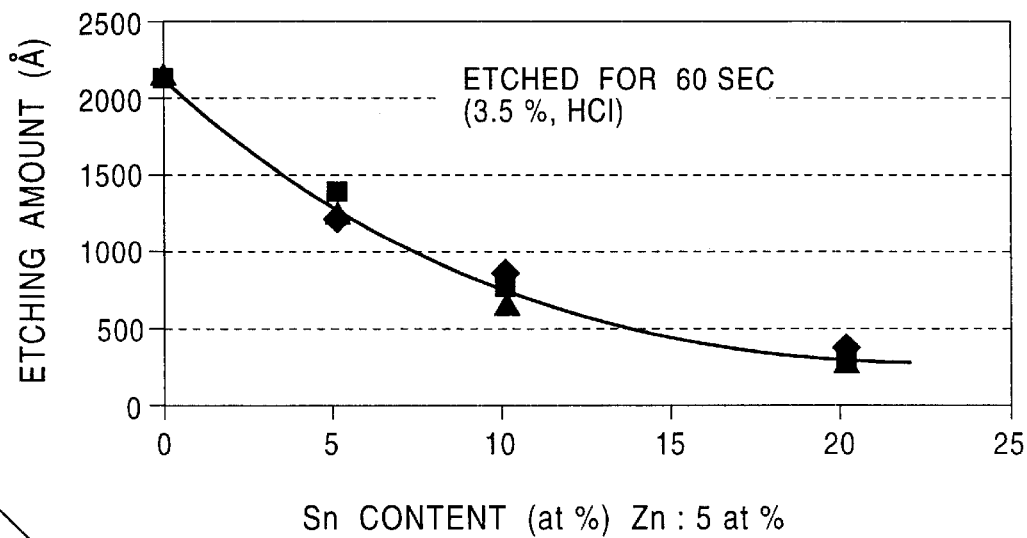
FIG. 10 shows the relationships between the Sn content and the etching amount in transparent electrically conductive oxide films

FIG. 10 shows the relationships between the tin content and the etching amount with respect to ITZO films as deposited before heat treatment, when the zinc content (the amount of Zn added) was fixed at 5 at % and amounts etched for about 60 seconds were observed with varied tin contents. As an etchant, a hydrochloric acid solution if about 3.5% (weak acid solution) was used.

As is obvious from the results shown in FIG. 10, as the Sn content increases, the etching amount decreases. Therefore, in order to miniaturize wiring using the transparent electrically conductive oxide film of the present invention, it is possible to properly select the etching rate (E/R) by adjusting the amount of Sn to be added. However, the etching amount obtained with an Sn content of about 20 at % is small, and even if the Sn content is further increased, the etching duration is extended, thus increasing the working time. Therefore, the upper limit of the Sn content is preferably set at about 20 at %.

Figure 11:
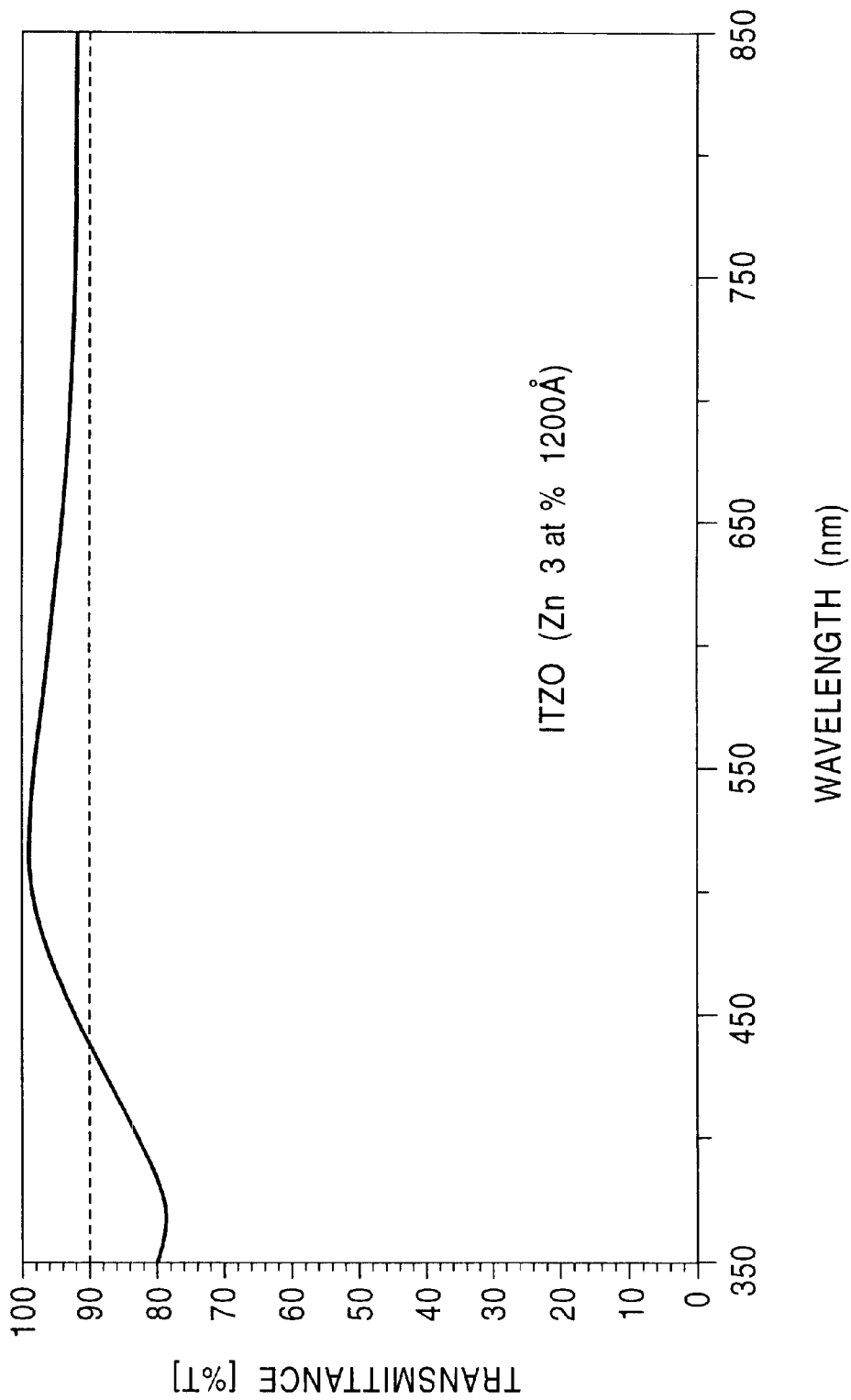
FIG. 11 shows the relationships between the transmittance and the wavelength in a transparent electrically conductive oxide film

FIG. 11 shows the relationships between the transmittance and the wavelength with respect to the ITZO film as deposited which was not subjected to heat treatment when the zinc content was set at about 3 at % and the tin content was set at about 9 at %.

In FIG. 11, the transparent electrically conductive oxide film of the present invention has a superior transmittance of more than about 90% in the visible light range (about 450 nm through about 750 nm). This value may be equal to or depending on the wavelength, superior to that of a transparent electrically conductive film composed of an indium-tin-oxide film which has been conventionally used. Therefore, even if the transparent electrically conductive oxide film of the present invention is used for pixel electrodes and transparent wiring for liquid crystal panels, a bright display may be obtained.

Figure 12:
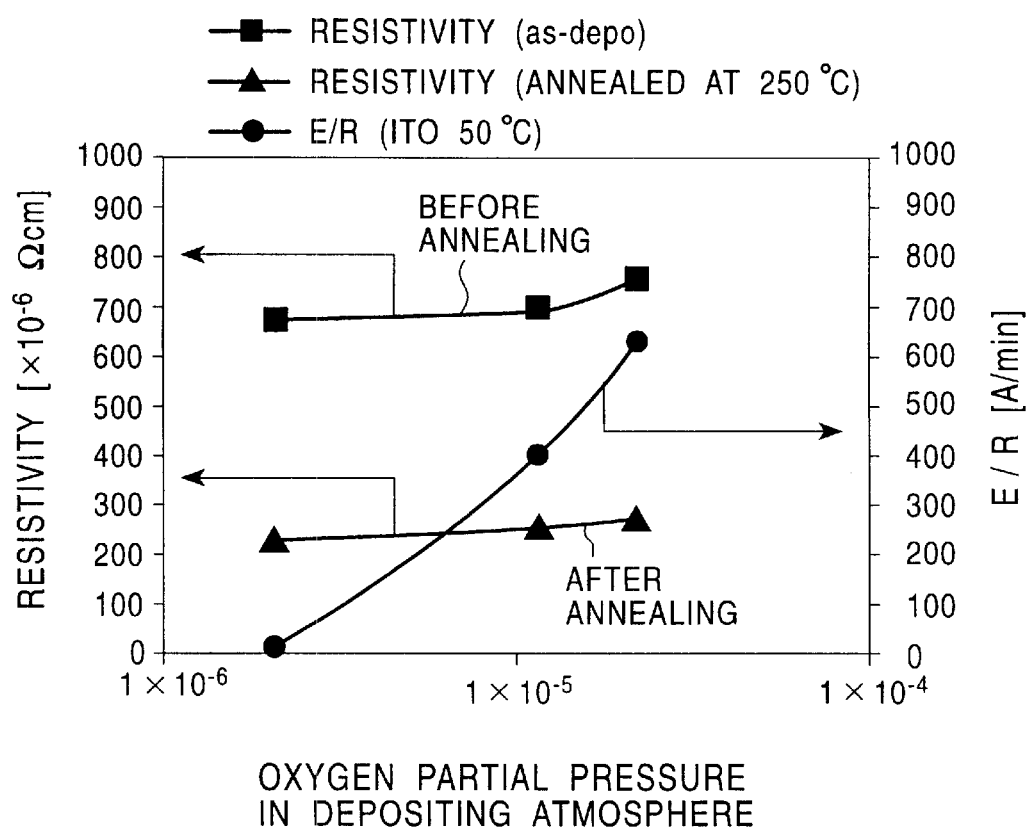
FIG. 12 shows the effect of the oxygen partial pressure in the depositing atmosphere on the resistivity of transparent electrically conductive films and the effect of the oxygen partial pressure in the depositing atmosphere on the etching rate of ITO films.

FIG. 12 shows the effect of the oxygen partial pressure ($O_2$ partial pressure) in the depositing atmosphere on the resistivity of films as deposited before annealing and on the resistivity of films after annealing with respect to ITZO films having the composition described above, and shows the effect of the oxygen partial pressure on the etching rate (E/R) of amorphous ITO films. Although it is possible to obtain amorphous ITO films having low etching rates by fine control of the oxygen partial pressure, unless the control of the oxygen partial pressure is performed strictly, an amorphous ITO film having locally different etching rates may be generated. This means that when wiring is formed by etching an amorphous ITO film, since the amorphous ITO film easily has etching nonuniformity depending on a variation in oxygen partial pressure in the depositing atmosphere, it may be difficult to obtain precisely fine wiring depending on the film quality in the amorphous ITO film.

Figure 13:
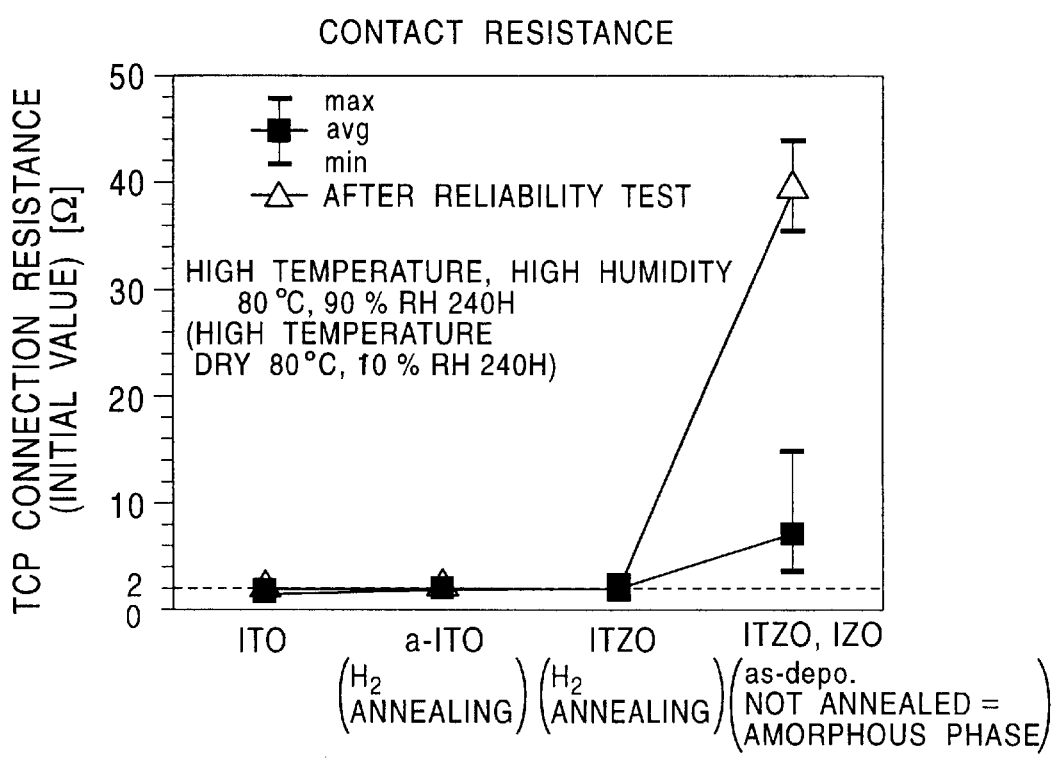
FIG. 13 shows the results of reliability tests for TCP connection resistances of transparent oxide electrically conductive films.

FIG. 13 shows the results of reliability tests after TCP connection was performed. The individual measured values are shown in Table 1 below. In order to obtain the "TCP resistance" shown in Table 1, after TCP connection was performed (connection to a metallic terminal electrode with a width of about $40 \times 10^{-6}$ cm), the resistance at any given connecting section was measured, and the value indicates an average of about 50 connecting sections to the metallic terminal electrode by TCP connection. In the reliability test, the resistance was measured after left in a high temperature, high humidity environment (about 80° C., about 90% RH, about 240 hours).

TABLE 1

| | $H_2$ Annealing | Film Structure | Initial TCP Resistance | After Reliability Test |
|---|---|---|---|---|
| ITO film | Not annealed | Polycrystalline | ○ 1.1 Ω | ○ 1.9 Ω |
| a-ITO film | Annealed | Polycrystalline | ○ 1.4 Ω | ○ 2.0 Ω |
| ITZO film | Annealed | Polycrystalline | ○ 3.7 Ω | ○ 2.3 Ω |
| IZO film | Not annealed | Amorphous | x 7.4 Ω | x 41.3 Ω |
| ITZO film | Not annealed | Amorphous | (x 7.4 Ω) | (x 41.3 Ω) |

○ satisfactory
x unsatisfactory

In either the IZO film or the a-ITO film, the contact resistance increases over time in air. The a-ITO film is crystallized by annealing treatment and the contact resistance remains low stably. Additionally, although not shown in Table 1, an annealed IZO film was found to be amorphous by X-ray diffraction analysis, and the contact resistance was improved, which was, however, not improved to the same degree as that of the ITO film. Another reliability test similar to that described above was performed in a higher temperature, drier environment (about 80° C., about 10% RH, about 240 H) and similar results as those shown in FIG. 13 were obtained. As a result, it has been found that the resistance of the ITZO film in the amorphous state can be decreased by annealing, and moreover, the low resistance can be maintained after the environmental test is performed.

Figure 14:
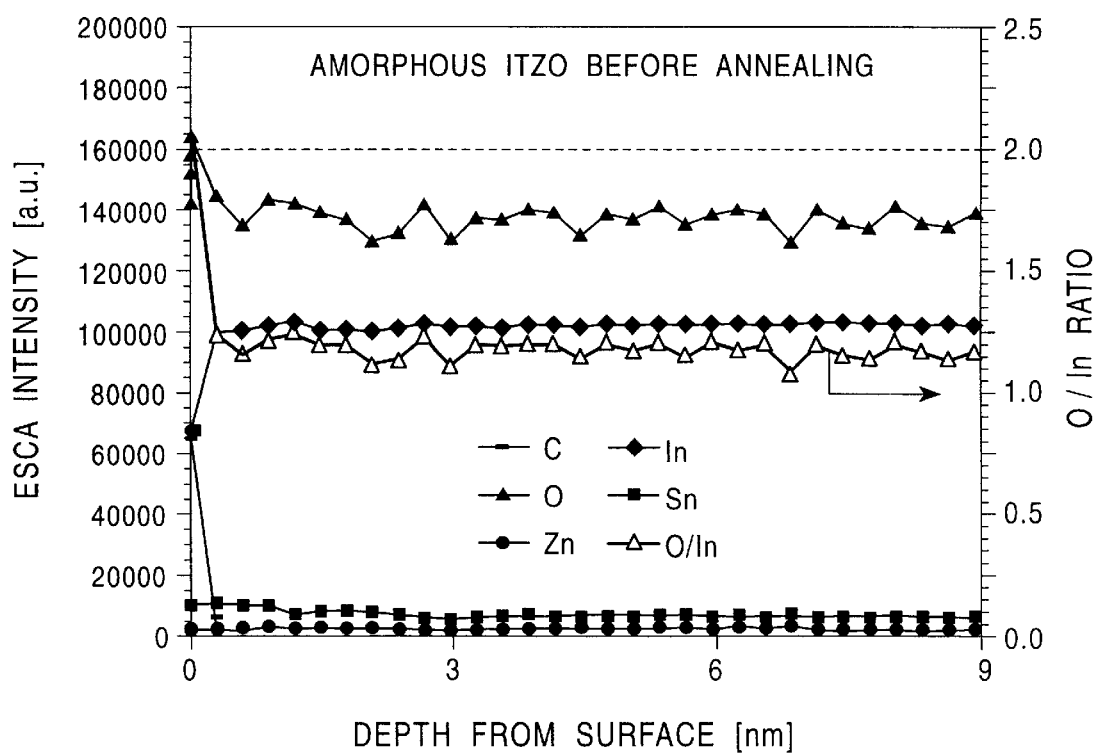
FIG. 14 is a graph which shows the results of spectroscopic analysis for a transparent electrically conductive oxide film invention in the amorphous state.
Figure 15:
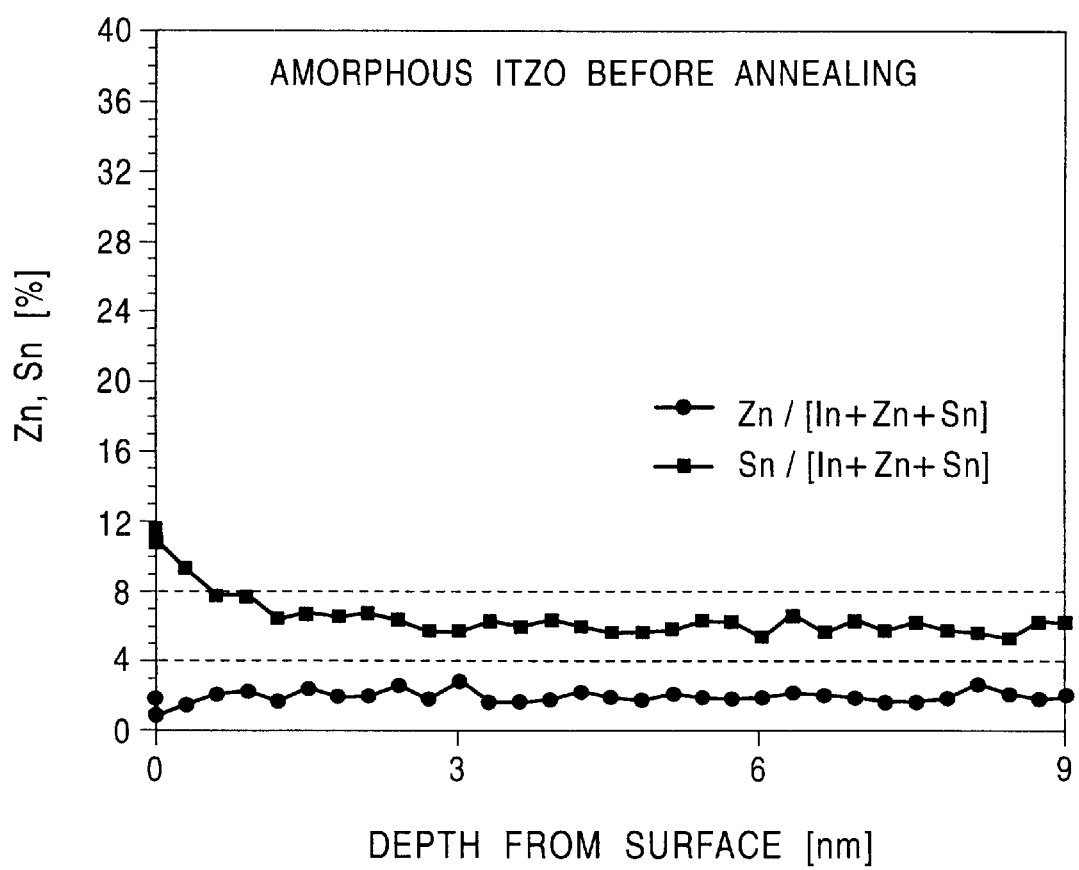
FIG. 15 is a graph which shows the tin content and the zinc content in the results of spectroscopic analysis for the transparent electrically conductive oxide film in the amorphous state.

FIG. 14 shows the results of spectroscopic analysis for an ITZO film containing about 2 at % of zinc and about 6 at % of tin before annealing, and FIG. 15 shows the zinc content and the tin content in the results of spectroscopic analysis.

Referring to FIGS. 14 and 15, with respect to the amorphous ITZO film before annealing, the oxygen content is significantly higher (at an O/In ratio of about 2.1 to 2.2) in the outermost surface section of the film because of reaction with moisture in air, and the tin content is also high in the outermost surface section.

Figure 16:
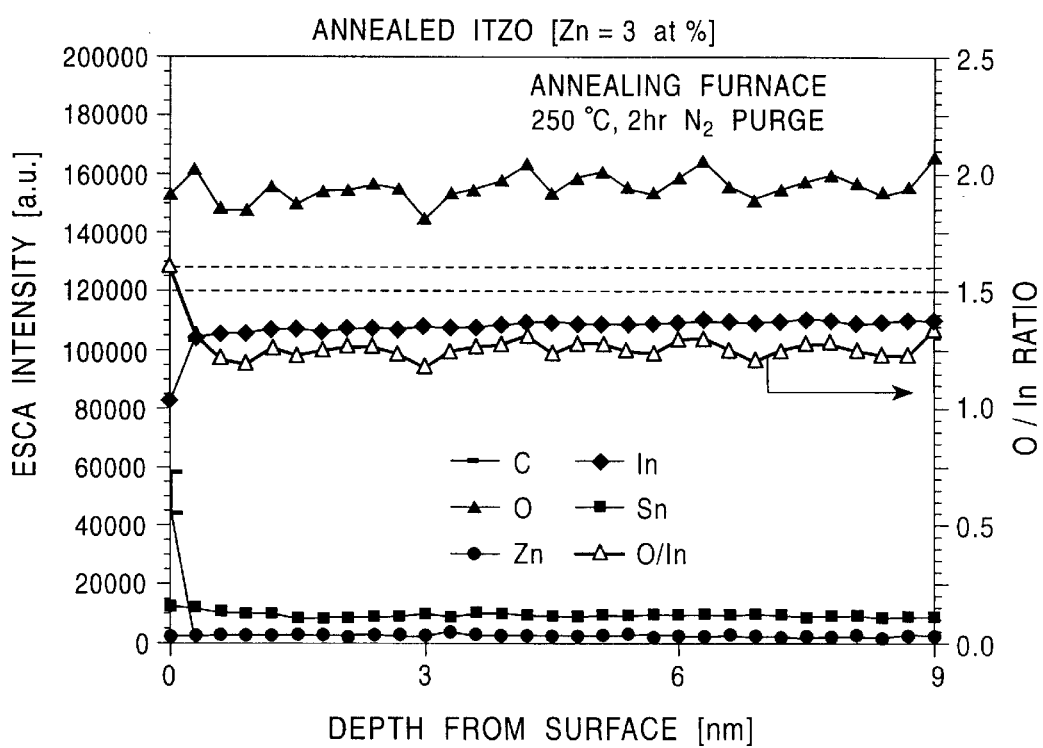
FIG. 16 is a graph which shows the results of spectroscopic analysis for a transparent electrically conductive oxide film in the polycrystalline state.

FIG. 16 shows the results of spectroscopic analysis for the ITZO film having the composition described above, and FIG. 17 shows the zinc content and the tin content in the results of spectroscopic analysis.

Figure 17:
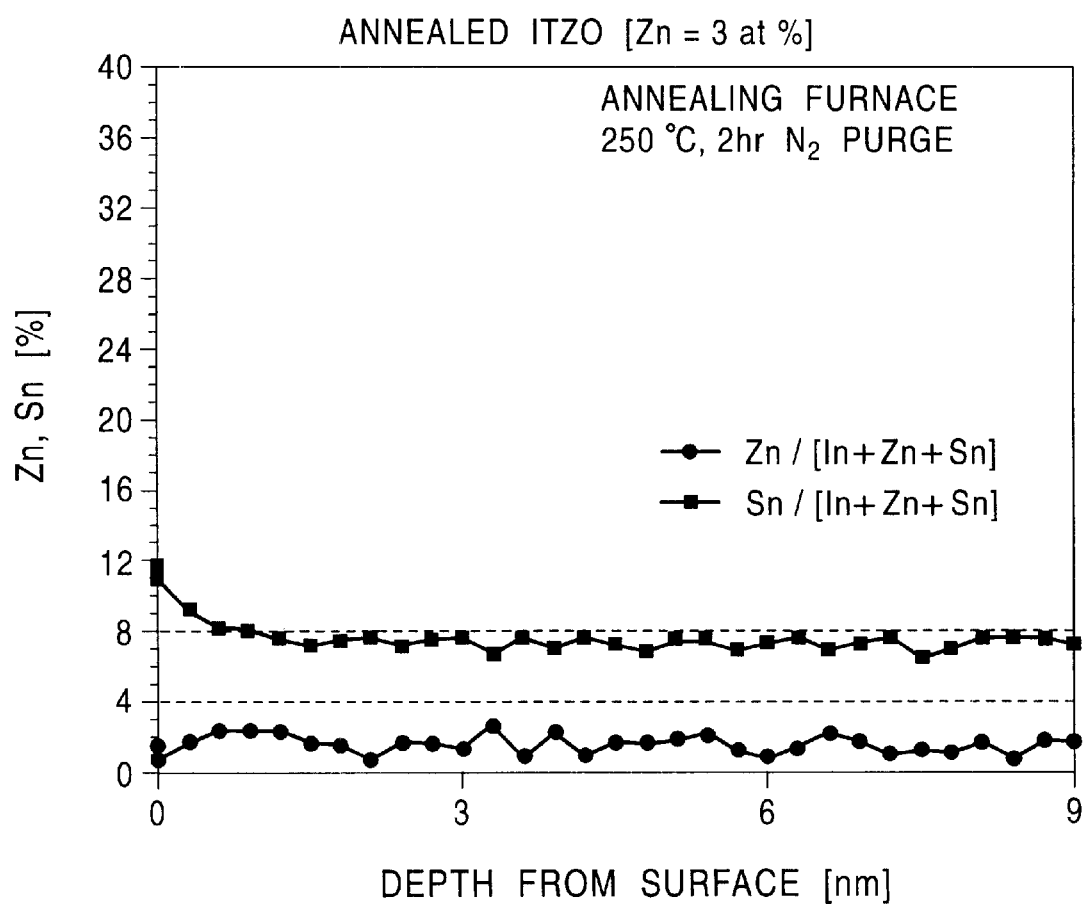
FIG. 17 is a graph which shows the tin content and the zinc content in the results of spectroscopic analysis for the transparent electrically conductive oxide film in the polycrystalline state.

Referring to FIGS. 16 and 17, the proportion of oxygen in the outermost surface section of the film is decreased (at an O/In ratio of about 1.6), and the proportion of oxygen in the outermost surface section is not increased due to crystallization by annealing.

Figure 18:
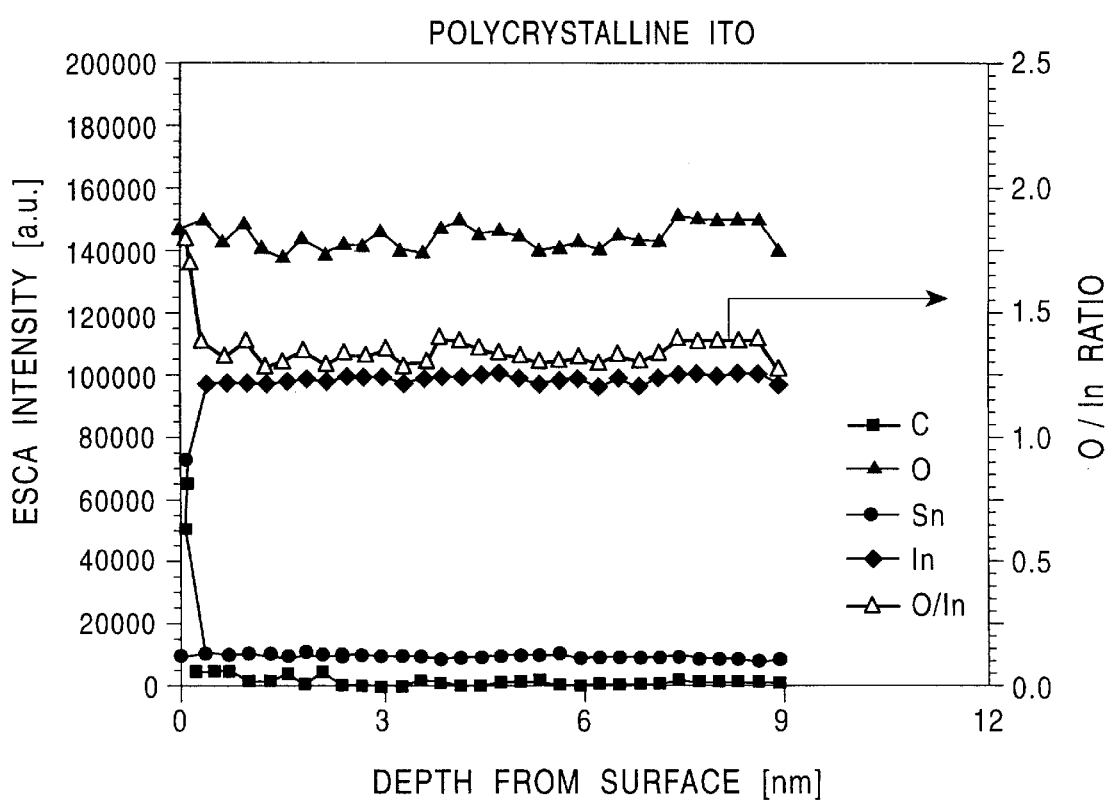
FIG. 18 is a graph which shows the results of spectroscopic analysis for an ITO film in the polycrystalline state.
Figure 19:
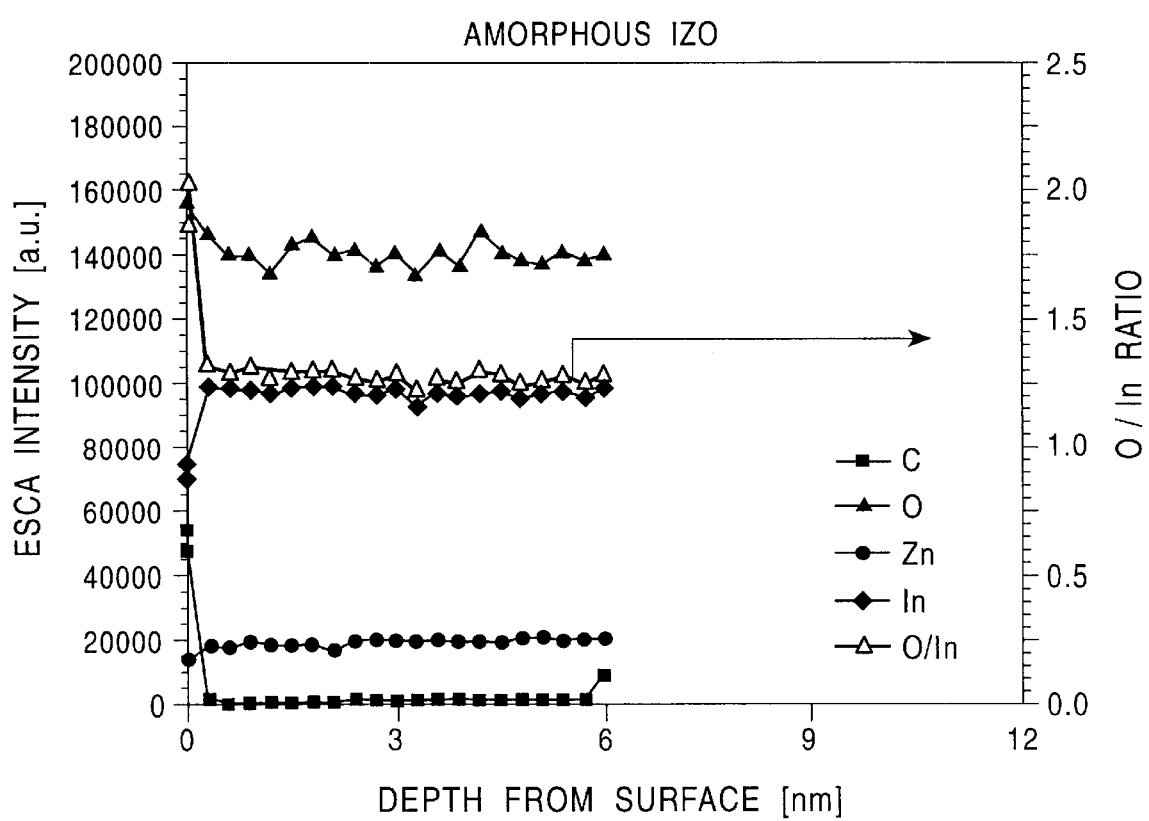
FIG. 19 is a graph which shows the results of spectroscopic analysis for an IZO film in the amorphous state.

FIG. 18 shows the results of spectroscopic analysis for a polycrystalline ITO film which was not annealed, and FIG. 19 shows the results of spectroscopic analysis for an amorphous IZO film.

In view of the results shown in FIGS. 14 to 19, compositional structures of the ITO film, IZO film, and ITZO film are compared. When the ITO film is assumed as a polycrystalline film in which the crystal structure of $In_2O_3$ as a principal ingredient is doped with $SnO_2$, tetravalent tin is believed to be activated to generate electron carriers. In contrast, when the IZO film is assumed as an amorphous film in which ZnO is doped, bivalent zinc is believed not to be activated in the amorphous state, thus not functioning as an acceptor. The ITO film is tin-rich in the surface of the film, and the IZO film is in the zinc-deficient state (Zn-poor state). Most noticeably, in the surface section of the film, the IZO film is more oxygen-rich than the ITO film.

In the structure containing $In_2O_3$ as the principal ingredient, excess indium which is not bonded to oxygen is believed to generate electron carriers. However, in the oxygen-rich composition, the oxygen-deficiency type conductive mechanism is inhibited, and a high-resistivity layer in which the generation of electron carriers is decreased is believed to be formed in the outermost surface. In the ITO film, tetravalent tin activated in the crystal site generates electron carriers. In the IZO film, electron carriers from the $In_2O_3$ structure relate to the conductive mechanism, and since zinc acts as an acceptor even if activated, zinc is believed not to be related to the conductive mechanism. Consequently, in the polycrystalline ITO film, the oxygen-deficiency type conductive mechanism functions mainly, and the conductive mechanism due to the doping effect by the activation of tin is combined thereto, thus securing high conductivity. However, in the amorphous IZO film, since the outermost surface section thereof is in the zinc-deficient state, the oxygen-deficiency type conductive mechanism is effective, and also since zinc acts as an acceptor due to doping, zinc is not related to conductivity. In contrast, in the ITZO film, in addition to the oxygen-deficiency type conductive mechanism, the doping type conductive mechanism due to the effect of tin which is added in the amount larger than that of zinc which acts as an acceptor is also employed, higher conductivity is believed to be obtained.

As described above, the transparent electrically conductive oxide film of the present invention is composed of the compound oxide containing indium oxide, tin oxide, and zinc oxide, in which the tin content is higher than the zinc content at least in the connecting section, and at least the connecting section has crystallinity. Consequently, in addition to the conductive mechanism in which excess indium of the indium oxide produces electron carriers, the conductive mechanism in which tetravalent tin is activated to increase electron carriers by adding tin as an n-type dopant to indium functions effectively, and simultaneously, an inhibition factor of zinc which consumes electron carriers may be reduced because activated tin acts as an acceptor for electron carriers. Thus, reaction with moisture, oxygen, or organic substances in air is inhibited, and satisfactory low resistance connection is anticipated. Additionally, since the transparent electrically conductive oxide film composed of the compound oxide may be etched by weak acids, such as diluted hydrochloric acid or organic acids, even if the structure provided with copper wiring is combined, it is possible to carry out etching treatment without eroding the copper wiring. Therefore, the etching process is facilitated, and freedom of design for circuit structures in which copper wiring and the transparent electrically conductive oxide film are combined is increased.

Preferably, the atomic percentage of zinc to the total of zinc, indium, and tin is in the range of about 2 at % through about 7 at %, and the atomic percentage of tin to the total of zinc, indium, and tin is in the range of about 5 at % through about 10 at % so that satisfactory conductivity and reaction inhibiting ability are obtained.

Since the electronic apparatus of the present invention is provided with the transparent electrically conductive oxide film as at least a portion of the electric circuit thereof, even if a miniaturized wiring structure is employed, it is possible to connect the transparent electrically conductive oxide film to other components with low resistance, and even if left in air, connection resistance is not greatly deteriorated. Also, etching may be performed using weak acids. Thus, it is possible to provide an electronic apparatus provided with wiring which can be subjected to fine working.

In a method for fabricating the substrate provided with the transparent electrically conductive oxide film, the transparent electrically conductive oxide film is formed in the amorphous state, patterning is performed by etching, and then at least a portion of the film is crystallized. Consequently, fine etching may be performed using weak acids in the amorphous state in which etching can be easily performed, and after crystallization is performed, connection to other conductors may be performed with low resistance. Thus, it is possible to provide the structure in which wiring is connected with low resistance even in the miniaturized circuit.

Various embodiments of the invention have been described and illustrated. However, the description and illustrations are by way of example only. Many more embodiments and implementations are possible within the scope of this invention and will be apparent to those of ordinary skill in the art. Therefore, the invention is not limited to the specific details, representative embodiments, and illustrated examples in this description. Accordingly, the invention is not to be restricted except in light as necessitated by the accompanying claims and their equivalents.

What is claimed is:

1. An electronic apparatus comprising an electric circuit, at least a portion of the electric circuit comprising a transparent electrically conductive oxide film, said film comprising a compound oxide containing indium oxide, tin oxide, and zinc oxide and comprising a connecting section to be connected to other conductors, wherein the tin content is higher than the zinc content at least in the connecting section, and at least the connecting section has crystallinity.

2. An electronic apparatus comprising an electric circuit, at least a portion of the electric circuit comprising a transparent electrically conductive oxide film, where the transparent electrically conductive oxide film comprises a compound oxide containing indium oxide, tin oxide, and zinc oxide, wherein the atomic percentage of zinc to the total of zinc, indium, and tin is in the range of about 1 at % through about 9 at %, the atomic ratio of tin to zinc is greater than or equal to about 1, the atomic percentage of tin to the total of zinc, indium, and tin is less than or equal to about 20 at %, and wherein at least a portion thereof has crystallinity.

3. A liquid crystal display device comprising a liquid crystal sandwiched between a pair of substrate, wherein at least one of the pair of substrates comprises a substrate provided with a transparent electrically conductive oxide film obtained by:

depositing a transparent electrically conductive amorphous oxide film onto the substrate, the transparent electrically conductive amorphous oxide film comprising a compound oxide containing indium oxide, tin oxide, and zinc oxide, wherein the atomic ratio of tin to zinc is greater than or equal to about 1;

patterning the transparent electrically conductive amorphous oxide film by etching; and performing heat treatment so that at least a portion of the patterned transparent electrically conductive amorphous oxide film is crystallized.

4. A liquid crystal display device comprising a liquid crystal sandwiched between a pair of substrates, wherein at least one of the pair of substrates comprises a substrate provided with a transparent electrically conductive oxide film obtained by:

depositing a transparent electrically conductive amorphous oxide film onto the substrate, the transparent electrically conductive amorphous oxide film comprising a compound oxide containing indium oxide, tin oxide, and zinc oxide, wherein the atomic percentage of zinc to the total of zinc, indium, and tin is in the range of about 1 at % through about 9 at %, the atomic ratio of tin to zinc is greater than or equal to about 1, and the atomic percentage of tin to the total of zinc, indium, and tin is less than or equal to about 20 at %;

patterning the transparent electrically conductive amorphous oxide film by etching; and performing heat treatment so that at least a portion of the patterned transparent electrically conductive amorphous oxide film is crystallized.

* * * * *